United States Patent [19]

Gabara

[11] Patent Number: 5,517,158
[45] Date of Patent: May 14, 1996

[54] SELF-TIMED OSCILLATOR CIRCUIT INCLUDING STARTING AND STOPPING CIRCUITRY

[75] Inventor: Thaddeus J. Gabara, Murray Hill, N.J.

[73] Assignee: AT&T Corp., Murray Hill, N.J.

[21] Appl. No.: 355,124

[22] Filed: Dec. 13, 1994

[51] Int. Cl.$^6$ ..................................................... H03B 5/12
[52] U.S. Cl. .................................. 331/117 FE; 331/167; 331/173
[58] Field of Search ......................... 331/117 R, 117 FE, 331/167, 173

[56] References Cited

U.S. PATENT DOCUMENTS 4,862,113  8/1989  Buhler et al. ........................ 331/117 R

OTHER PUBLICATIONS

T. Gabara, "Pulse Power Supply CMOS-PPS CMOS", 1994 IEEE Symposium on Low Power Electronics, San Diego, CA, Oct. 10–12, 1994, pp. 98–99.

Primary Examiner—Siegfried H. Grimm

[57] ABSTRACT

A relatively simple low-power-dissipation oscillator circuit comprises an inductor in series with a capacitor. Self-timing circuitry connected to an output node point between the inductor and the capacitor compensates for resistive losses in the circuit and thereby insures generation of a constant-amplitude output sine wave suitable for driving PPS CMOS circuitry. The oscillator circuit also includes starting and stopping circuitry connected to the inductor. To conserve power during so-called data inactive periods, the oscillator circuit can be abruptly stopped in a manner that preserves stored states in the CMOS circuitry and provides an output voltage suitable for powering conventional (non-PPS) CMOS circuitry while establishing a reliable basis for subsequently reinitiating oscillations.

8 Claims, 2 Drawing Sheets

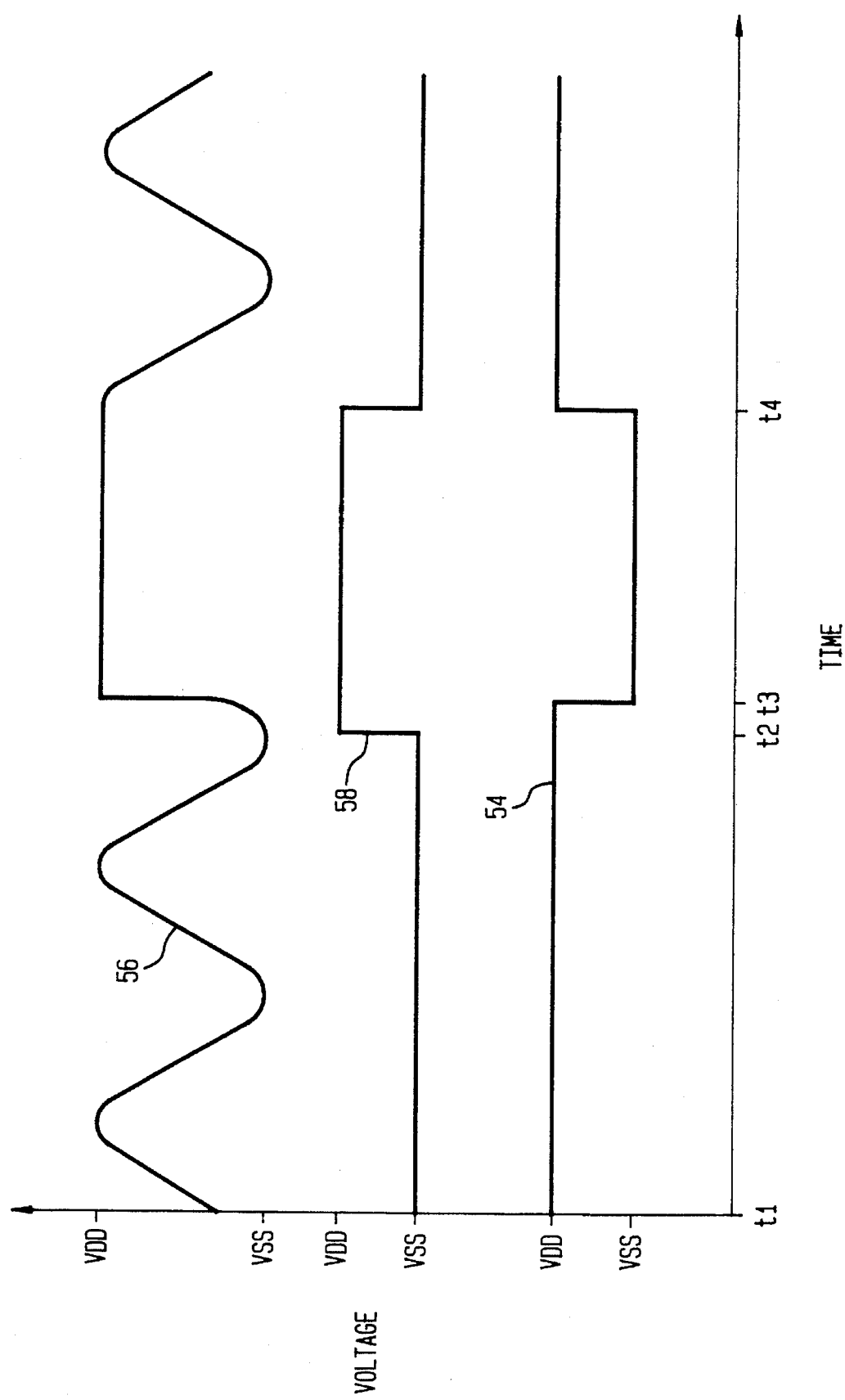

1

SELF-TIMED OSCILLATOR CIRCUIT INCLUDING STARTING AND STOPPING CIRCUITRY

BACKGROUND OF THE INVENTION

This invention relates to an oscillator circuit and, more particularly, to an oscillator circuit adapted to serve as a power supply for an integrated-circuit chip that utilizes complementary metal-oxide-semiconductor (CMOS) technology.

It is known that low-power-dissipation operation of a conventional CMOS circuit can be achieved if the power supply lead of the circuit is ramped repetitively between VDD and VSS. During the so-called power-down phase of each ramped cycle, the state of the circuit is stored on parasitic capacitances. This quasi-static CMOS circuit technique is called PPS (pulsed power supply) CMOS and is characterized by a power dissipation property that is typically approximately an order of magnitude less than that of conventional CMOS. The technique is described in "Pulsed Power Supply—PPS CMOS" by T. J. Gabara, *Proceedings of 1994 IEEE Symposium on Low Power Electronics*, San Diego, Calif., Oct. 10–12, 1994, pages 98–99. Further, the technique is described in T. J. Gabara's copending commonly assigned U.S. patent application designated Ser. No. 08/225,950, filed Apr. 8, 1994, now U.S. Pat. No. 5,450,027.

In practice, an oscillator circuit designed to generate a sinusoidal waveform can be utilized to power PPS CMOS circuits. Ideally, such an oscillator circuit should be relatively simple and should itself exhibit a relatively low-power-dissipation characteristic.

As the trend grows to miniaturize electronic equipment and to make it more portable, increasing emphasis is being put on trying to devise other ways to reduce the power dissipation of such equipment. Thus, even in equipment utilizing low-power-dissipation PPS CMOS circuits, it is generally advantageous during so-called inactive periods (for example, when no new data signals are being applied to the equipment for extended periods of time) to conserve power by connecting the PPS circuits to a constant-VDD power supply. When so connected, the circuits resemble conventional CMOS circuits in every way. And, importantly, no power (except that stemming from diode leakage currents) is thereby consumed during the inactive periods. Once input data signals resume, the circuits are reconnected to the pulsed (or sine-wave) power supply thereby to enable operation during active periods in the unique low-power-dissipation manner that is characteristic of PPS circuits. Such switching between a pulsed power supply (during active data periods) and a constant-VDD power supply (during inactive data periods) is described in concept in the aforecited application.

SUMMARY OF THE INVENTION

In accordance with the principles of the present invention, a relatively simple low-power-dissipation oscillator circuit is provided for generating sine-wave signals suitable for driving PPS CMOS circuits. The oscillator circuit comprises an inductor connected in series with a capacitor that is, for example, the effective capacitance of the CMOS circuits to be driven. Self-timed circuitry connected to an output node point between the inductor and the capacitor compensates for resistive losses in the circuit and thereby insures that a constant-amplitude sinusoid is generated.

In further accord with the invention, the oscillator circuit is designed to be stopped during inactive periods. Stopping occurs rapidly, without any ringing, while preserving the states of signals stored in the CMOS circuits. During stopped intervals, VDD is connected to the output node point, whereby power is conserved during inactive periods. Or, if desired, conventional (non-PPS) operation of some or all of the CMOS circuits connected to the output node point is thereby made feasible during the so-called inactive periods. In any case, the oscillator circuit is stopped in a manner that guarantees that it can be restarted later, with virtually no oscillatory build-up time, to provide the desired sine-wave output for PPS operation.

BRIEF DESCRIPTION OF THE DRAWING

A complete understanding of the present invention and of the above and other features and advantages thereof will be apparent from the detailed description below taken in conjunction with the accompanying drawing, in which:

and FIG. 2 shows the waveforms of various signals applied to and generated by the FIG. 1 circuit.

DETAILED DESCRIPTION

Figure 1:
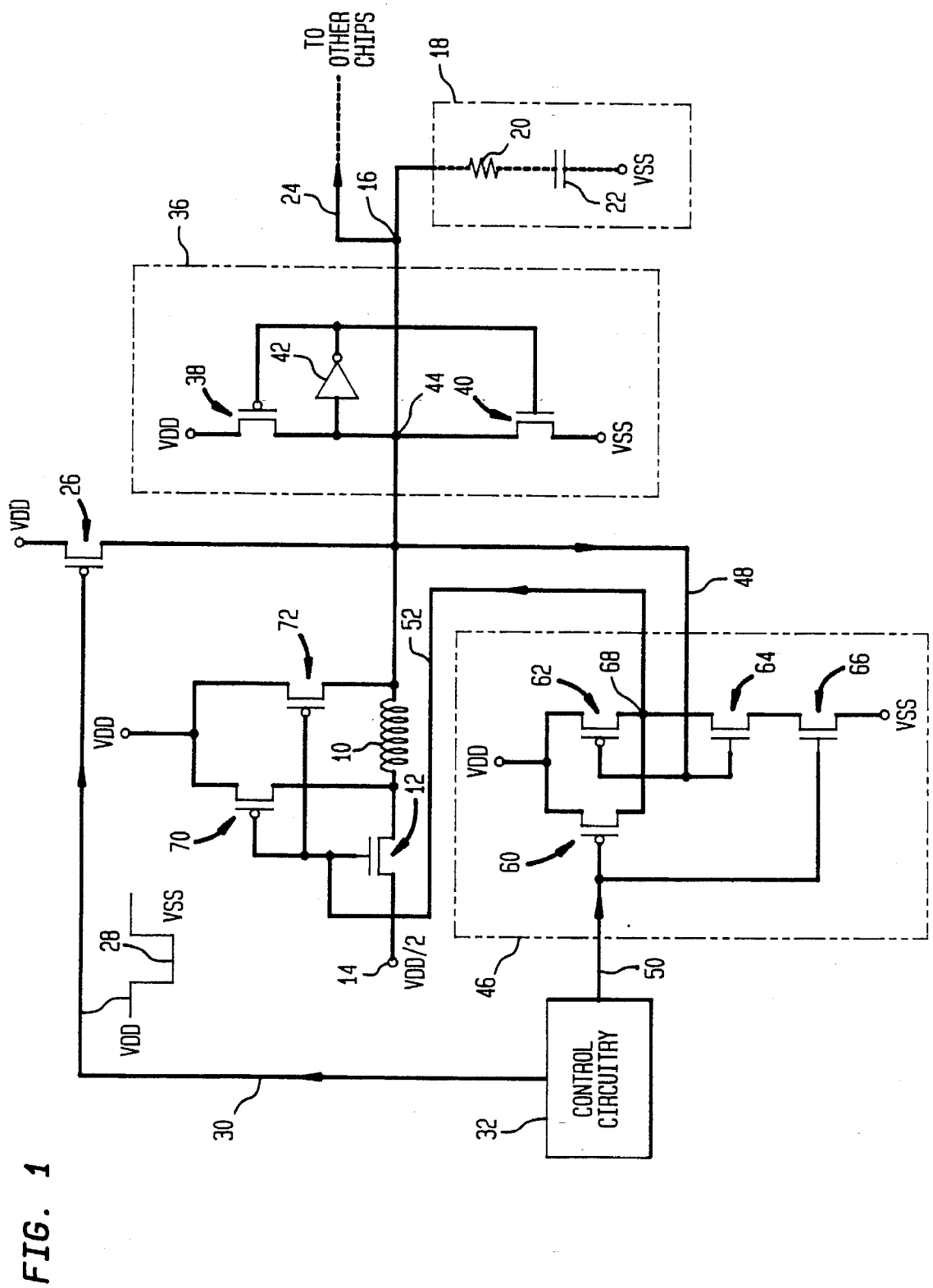
FIG. 1 is a schematic representation of a specific illustrative oscillator circuit made in accordance with the principles of the present invention.

The specific illustrative oscillator circuit shown in FIG. 1 includes an inductor 10. The left-hand end of the inductor 10 is connected via the source-to-drain path of a conventional n-channel MOS transistor device 12 to one terminal 14 of a fixed-value direct-current power supply. In one particular example, the terminal 14 is the positive terminal of a power supply designated VDD/2. Illustratively, VDD herein will be assumed to have a value of about +5 volts. The other terminal of the power supply VDD/2 is connected to a point of reference potential such as ground. This other terminal is identified herein by the designation VSS.

The device 12 of FIG. 1 is intended to serve in effect as an ON–OFF switch. Thus, illustratively, the gate width of the device 12 is designed to be relatively large, for example, about 20,000 micrometers (μm) wide, thereby to insure that the resistance of the device 12 in its ON state will be relatively low.

The right-hand end of the inductor 10 of FIG. 1 is connected to an output node point 16. In turn, the node point 16 is connected to a semiconductor chip 18 that includes CMOS integrated circuitry thereon. The equivalent circuit of the totality of the CMOS circuitry on the chip 18 driven from the node point 16 comprises a resistor 20 and a capacitor 22 connected in series therewith. As indicated in FIG. 1, the bottom end of the capacitor 22 is connected to VSS.

Additional CMOS circuitry on other chips may also be driven from the output node point 16 shown in FIG. 1. Lead 24 in FIG. 1 extends to such other chips.

Further, although the oscillator circuit of FIG. 1 is in effect depicted as being separate from the chip 18 and from whatever additional chips may be connected to the lead 24, it may in some cases be advantageous to include the herein-described oscillator circuit (except perhaps for the relatively large inductor 10) on the chip 18 or on one of the other chips connected to the lead 24. Or it may be more feasible to fabricate the oscillator circuit and its associated circuitry (to be described below) on a chip or module that is separate and distinct from the driven chips.

The resonant portion of the oscillator circuit shown in FIG. 1 comprises the series-connected inductor 10 and the effective capacitor 22. In practice, the inductor 10 typically has a value in the range of about 100-to-2000 nanoHenries, and the capacitor 22 has a value in the range of approximately 200-to-1000 nanofarads. A circuit containing such components oscillates, for example, at a frequency in the range of about 3.5-to-35 megaHertz.

Illustratively, to commence oscillations in the circuit of FIG. 1, the right-hand end of the inductor 10 is initially driven to a voltage that differs from VDD/2. Specifically, in the particular example represented in FIG. 1, the right-hand end of the inductor 10 is initially driven to VDD. This is done by activating a conventional p-channel MOS transistor device 26. When the device 26 is rendered conductive, the right-hand end of the inductor 10 is directly connected to VDD via the source-to-drain path of the device 26.

By way of example, the p-channel device 26 of FIG. 1 is activated by applying thereto a negative-going pulse. Such a pulse, which is designated in FIG. 1 by reference numeral 28 and is shown as being applied to a lead 30 that is connected to the gate electrode of the device 26, is supplied by conventional control circuitry 32. In practice, the potential on the lead 30 is ordinarily at VDD, whereby the p-channel device 26 is not activated. To activate the p-channel device 26 and to thereby initiate oscillations in the depicted circuit (assume that the n-channel device 12 is also activated, as described in detail later below), the level of the voltage applied to the lead 30 is temporarily decreased by the control circuitry 32 to VSS. A negative-going such pulse applied to the gate electrode of the device 26 for about ten nanoseconds is effective to render the device 26 conductive and to thereby connect VDD to the right-hand end of the inductor 10. Current flow is thereby initiated through the inductor 10.

Oscillations thus commence in the circuit of FIG. 1 in response to the momentary lifting of the potential of the right-hand end of the inductor 10 to VDD. Ideally, these oscillations once started would continue in the series-connected oscillatory path that comprises the inductor 10 and the capacitor 22. But, due to the presence in the oscillatory path of the resistor 20, and due additionally to the fact that the inductor 10 unavoidably includes some resistance and that the n-channel device 12 constitutes some resistance even when fully conducting, the initiated oscillations would in practice gradually diminish in amplitude and eventually cease.

In accordance with the principles of the present invention, circuitry 36 shown in FIG. 1 is provided to in effect compensate for the aforespecified resistive losses in the series-resonant oscillatory path. In particular, the circuitry 36 is designed to insure that the maximum and minimum amplitudes of the sine-wave signals appearing at the output node point 16 remain constant at prescribed values. Thus, for example, as described below, the circuitry 36 insures that each sine wave appearing at the node point 16 has a maximum amplitude of VDD and a minimum amplitude of VSS.

Illustratively, the circuitry 36 of FIG. 1 comprises a relatively small (for example, 100-μm-wide gate) p-channel MOS transistor device 38 having its source-to-drain path connected in series with the source-to-drain path of a relatively small (for example, 50-μm-wide gate) n-channel MOS transistor device 40. Also, the source electrode of the device 38 is connected to VDD, and the source electrode of the device 40 is connected to VSS. Moreover, the gate electrodes of the devices 38 and 40 are directly connected together. Further, the connected-together drain electrodes of the devices 38 and 40 are directly connected both to the right-hand end of the inductor 10 and to the output node point 16. Additionally, the input of a CMOS inverter 42 (for example, a conventional CMOS inverter or a Schmidt-trigger inverter) is connected to the connected-together drain electrodes of the devices 38 and 40, and the output of the inverter 42 is connected to the connected-together gate electrodes of the devices 38 and 40.

To understand the operation of the circuitry 36 of FIG. 1, assume, for example, that the depicted oscillator circuit has been triggered into oscillation by a pulse on the lead 30 and that the positive-going portion of a sine wave appears at node point 44. The point 44 is connected to the right-hand end of the inductor 10 and to the input of the inverter 42. As a result, the inverter 42 provides at its output a negative-going version of the signal applied to its input. When this negative-going signal exceeds the threshold voltage of the p-channel device 38, the device 38 will begin to conduct. (Subsequently, this negative-going signal disables the n-channel device 40.) And, as the positive-going sine wave appearing at the node point 44 continues to increase, the device 38 is rendered more conductive. In particular, the circuitry 36 is designed such that, as the positive-going signal at the node point 44 approaches its maximum value, the device 38 is rendered fully conducting, thereby to connect a voltage approximating VDD to the node point 44 and thus also to the output node point 16. In this way, the circuitry 36 in effect supplies energy to compensate for resistive losses in the oscillatory path and thereby insures, in a self-timed manner, that the positive-going excursion of each sine-wave signal appearing at the output node point 16 reaches a maximum value of approximately VDD.

Similarly, in response to the negative-going portion of a sine-wave signal appearing at the node point 44 of FIG. 1, the inverter 42 provides at its output a positive-going version of the signal applied to its input. When this positive-going signal exceeds the threshold voltage of the n-channel device 40, the device 40 will begin to conduct. (Subsequently, this positive-going signal disables the p-channel device 38.) And, as the negative-going sine wave appearing at the node point 44 continues to increase, the device 40 is rendered more conductive. In particular, the circuitry 36 is designed such that, as the negative-going signal at the node point 44 approaches its maximum (most negative) value, the device 40 is rendered fully conducting, thereby to connect a voltage approximating VSS to the node popint 44 and thus also to the output node point 16. In this way, the circuitry 36 in effect again supplies energy to compensate for resistive losses in the oscillatory path and thereby insures, in a self-timed manner, that the negative-going excursion of each sine-wave signal appearing at the output node point 16 reaches a minimum value of approximately VSS.

In further accord with the invention, the oscillator circuit shown in FIG. 1 is designed to be stopped and restarted in a unique way. As described in detail below, this is done under control of signals applied to the oscillator circuit by the circuitry 32.

During so-called inactive times in a digital data system, no data signals are being applied to or processed by the system. To conserve power, it is generally advantageous during those times to stop the oscillator circuit that ordinarily supplies sine-wave signals to the PPS CMOS circuits of the system. Later, just before data activity resumes, the oscillator circuit is restarted.

In accordance with the invention, stopping of the oscillator circuit of FIG. 1 is accomplished virtually instantaneously. In any case, sine-wave oscillations generated during active periods are stopped so abruptly that the final desired steady state of the circuit during inactive periods is achieved without a significant transitional oscillatory behavior. Such abrupt stopping, coupled with the fact that the output node point 16 is virtually instantaneously driven to the value VDD, insures that states stored in PPS CMOS circuits connected to the node point 16 are unequivocally and accurately preserved during and after the transition of the oscillator circuit from active to inactive.

Moreover, setting the output node point 16 of FIG. 1 at VDD during inactive periods establishes a basis for an extremely rapid reinitiation of oscillations at a subsequent time. In practice, sine-wave oscillations can thereby be reinitiated sufficiently rapidly that no transitional oscillatory behavior occurs during restarting, whereby stored states in the driven PPS CMOS circuits are not thereby deleteriously affected.

The setting of the output node point 16 at VDD during so-called inactive periods is advantageous for another reason. By establishing the point 16 at VDD, any conventional CMOS circuits connected thereto and designed to be operated from a fixed-value power supply are in effect thereby powered. Thus, even when no sine-wave signals are being applied to the node point 16, any conventional CMOS circuits connected thereto are powered in their usual way and may therefore if desired be operated in their normal fashion during PPS-inactive periods.

Specific illustrative circuitry adapted to terminate and reinitiate oscillations in the herein-described oscillator circuit is shown in FIG. 1. By way of example, this circuitry includes a NAND circuit 46. Input signals are respectively applied to the circuit 46 via input leads 48 and 50, and the output signal generated by the circuit 46 appears on output lead 52. The input signals applied to the lead 48 are the signals that appear at the output node point 16. The input signals applied to the lead 50 are supplied by the control circuitry 32. And the output signal appearing on the lead 52 is applied to the gate electrode of the n-channel device 12.

During active periods, when the oscillator circuit of FIG. 1 is designed to supply sine-wave signals to the output node point 16, the voltage level appearing on the output lead 52 of the NAND circuit 46 is VDD. This output condition is represented in FIG. 2, wherein waveform 54 is shown as having the value VDD during the time interval t1-to-t2. In response thereto, the input n-channel device 12 is maintained in its conducting state, whereby its source-to-drain path completes a connection between the terminal 14 (VDD/2) and the left-hand end of the inductor 10. As a result, previously initiated oscillations in the aforedescribed series-resonant path continue in the time period t1-to-t2, as represented by waveform 56.

During the time period t1-to-t2 shown in FIG. 2, the control circuitry 32 of FIG. 1 applies to the NAND circuit 46 via the input lead 50 a voltage level having the value VSS, as represented by waveform 58. As a result, as will be described in detail below, the output lead 52 of the circuit 46 remains at VDD regardless of the nature of the signals appearing at the output node 16. This insures that the depicted oscillator circuit will continue to provide a sine-wave output at the node point 16 until a stop or halt signal is applied to the NAND circuit 46 by the control circuitry 32.

The specific illustrative NAND circuit 46 of FIG. 1 is conventional. The circuit 46 comprises, for example, two p-channel MOS transistor devices 60 and 62 connected to two n-channel MOS transistor devices 64 and 66 as well as to VDD and VSS, as shown. Thus, it is apparent that, so long as the voltage applied by the control circuitry 32 to the input lead 50 remains at VSS (as it does, for example, in the time interval t1-to-t2 of FIG. 2), the p-channel device 60 is activated and VDD is connected to node point 68 to which output lead 52 is also connected. This insures (regardless of the voltage levels appearing on the input lead 48) that the n-channel device 12 in the oscillatory path remains in its low-resistance state (conducting).

Assume now that at time t2 (FIG. 2) the control circuitry 32 applies a stop signal via the lead 50 to the NAND circuit 46 of FIG. 1, thereby to initiate a so-called inactive period in the digital data system of which the depicted circuitry constitutes a part. Such a stop signal is represented in FIG. 2 by the waveform 58 going to the value VDD at t2. Thus, at t2, the p-channel device 60 is deactivated and the n-channel device 66 is activated. Subsequently, at t3, the positive-going excursion of the sine wave 56 reaches a value at which the p-channel device 62 is deactivated and the n-channel device 64 is activated. In turn, this causes the node point 68 connected to the output lead 52 to be in effect disconnected from VDD (via the deactivated devices 60 and 62) and to be connected to VSS (via the activated devices 64 and 66). This change from VDD to VSS, at t3, on the output lead 52 of the NAND circuit 46 is represented in FIG. 2 by the waveform 54.

The application of VSS to the gate electrode of the n-channel device 12 causes the device 12 to be deactivated, whereby the oscillatory path that had been generating sine waves is thereby interrupted. At the same time, VSS is also applied to the respective gate electrodes of two p-channel MOS transistor devices 70 and 72 (each, for example, having a gate width of about 1500 μm). This causes the devices 70 and 72 to be activated, whereby the respective ends of the inductor 10 are thereby connected via the source-to-drain paths of the devices 70 and 72 to VDD.

The simultaneous application of VDD to the respective ends of the inductor 10 of FIG. 1 at t3 (FIG. 2) in effect virtually instantly drains energy therefrom. In turn, this insures that oscillations attributable to energy remaining in the inductor will not occur subsequent to t3. Also, importantly, all the energy of the series-resonant arrangement is thereby retained in the capacitor 22, which insures a successful restart of oscillations later. The waveform 56 in FIG. 2 shows an idealized representation of the cessation of oscillations at t3.

Subsequent to t3 (FIG. 2), the voltage appearing at the output node point 16 of FIG. 1 is VDD, as indicated by waveform 56. And VDD remains applied to the node point 16 (thereby charging to VDD parasitic capacitances connected to the point 16) until some subsequent time (t4) when the level applied to the input lead 50 by the control circuitry 32 goes from VDD to VSS. In response thereto, the n-channel device 66 is deactivated and the p-channel device 60 is activated, whereby VDD is again applied to the output lead 52. Consequently, the n-channel device 12 in the oscillatory path is reactivated, and the p-channel devices 70 and 72 are deactivated. Once the device 12 is reactivated, at t4, thereby to connect VDD/2 to the left-hand end of the inductor 10, and because the node point 16 is charged to VDD, sine-wave oscillations recommence almost instantly, as indicated by waveform 56 in the interval subsequent to t4.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed is:

1. An oscillator circuit comprising
an inductor having first and second terminals,
a capacitor having first and second terminals,
means adapted to connect said first inductor terminal to a first direct-current power source,
an output node point,
means connecting said second inductor terminal to said output node point,
means connecting said output node point to said first capacitor terminal,
means adapted to connect said second capacitor terminal to a point of reference potential,
said inductor and said capacitor constituting a series-resonant oscillatory path designed to oscillate at a specified frequency to provide a sine wave at said output node point,
and self-timing means connected to said output node point and responsive to each positive-going excursion of said sine wave for supplying energy to compensate for resistive losses in said path thereby to insure that each positive-going excursion of the sine wave extends to a prespecified maximum value and responsive to each negative-going excursion of said sine wave for supplying energy to compensate for resistive losses in said path thereby to insure that each negative-going excursion of the sine wave extends to a prespecified minimum value,
further including starting means connected to said output node point for initially and momemtarily applying to said node point a second direct-current power source whose voltage has a value that differs from that provided by said first source, thereby to initiate oscillations in said path.

2. A circuit as in claim 1 wherein said means adapted to connect said first inductor terminal to said first direct-current power source includes a first switch.

3. A circuit as in claim 2 further including second and third switches adapted to respectively connect the first and second terminals of said inductor to said second power source.

4. A circuit as in claim 3 wherein said first, second and third switches comprise first, second and third MOS transistor devices, repectively.

5. A circuit as in claim 4 further including means for applying a stop signal to said first, second and third devices to render said first device nonconductive and to render said second and third devices conductive thereby to interrupt said oscillatory path and at the same time to drain energy from said inductor, whereby said output node point is clamped at the value of said second power source.

6. A circuit as in claim 5 further including control circuitry, and wherein said means for applying a stop signal to said devices comprises a NAND unit having an output terminal and first and second input terminals, and still further including means connecting said control circuitry to said first input terminal of said NAND unit, means connecting said output node point to said second input terminal of said NAND unit, and means connecting said output terminal of said NAND unit to the gate electrode of each of said first, second and third devices.

7. An oscillator circuit comprising
an inductor having first and second terminals,
a capacitor having first and second terminals,
means adapted to connect said first inductor terminal to a first direct-current power source,
an output node point,
means connecting said second inductor terminal to said output node point,
means connecting said output node point to said first capacitor terminal,
means adapted to connect said second capacitor terminal to a point of reference potential,
said inductor and said capacitor constituting a series-resonant oscillatory path designed to oscillate at a specified frequency to provide a sine wave at said output node point
and self-timing means connected to said output node point and responsive to each positive-going excursion of said sine wave for supplying energy to compensate for resistive losses in said path thereby to insure that each positive-going excursion of the sine wave extends to a prespecified maximum value and responsive to each negative-going excursion of said sine wave for supplying energy to compensate for resistive losses in said path thereby to insure that each negative-going excursion of the sine wave extends to a prespecified minimum value,
wherein said self-timing means comprises
an inverter having input and output terminals,
a p-channel MOS transistor device having gate, source and drain electrodes,
an n-channel MOS transistor device having gate, source and drain electrodes,
means directly connecting together the drain electrodes of said p-channel and n-channel devices,
means directly connecting together the gate electrodes of said p-channel and n-channel devices,
means connecting the output terminal of said inverter to said connected-together gate electrodes,
means connecting the input terminal of said inverter to said connected-together drain electrodes and to said output node point,
means adapted to connect the source electrode of said p-channel device to a direct-current power source whose output voltage has a value that exceeds that provided by said first source,
and means adapted to connect the source electrode of said n-channel device to a point of reference potential.

8. A circuit as in claim 7 wherein said capacitor comprises the total equivalent capacitance of an assembly of CMOS circuitry connected to and designed to be driven from said output node point.

* * * * *